US006529926B1

(12) United States Patent
Capofreddi

(10) Patent No.: US 6,529,926 B1
(45) Date of Patent: Mar. 4, 2003

(54) ANALOG DISCRETE-TIME FIR FILTER

(75) Inventor: Peter Capofreddi, San Francisco, CA (US)

(73) Assignee: Santel Networks, Inc., Newark, CA (US)

( * ) Notice: Subject to any disclaimer, the term of this patent is extended or adjusted under 35 U.S.C. 154(b) by 0 days.

(21) Appl. No.: 09/665,966

(22) Filed: Sep. 20, 2000

(51) Int. Cl.[7] .............................. G06F 17/10; G06G 7/02
(52) U.S. Cl. ..................... 708/316; 708/319; 708/819
(58) Field of Search ................ 708/316, 319, 708/819

(56) References Cited

U.S. PATENT DOCUMENTS

| 4,811,263 A | * | 3/1989 | Hedley et al. | 708/316 |
| 5,016,207 A | * | 5/1991 | Fuji et al. | 708/316 |
| 5,311,459 A | * | 5/1994 | D'Luna et al. | 708/319 |
| 6,032,171 A | * | 2/2000 | Kiriaki et al. | 708/319 |
| 6,035,312 A | * | 3/2000 | Hasegawa | 708/319 |
| 6,035,320 A | * | 3/2000 | Kiriaki et al. | 708/319 |
| 6,058,407 A | * | 5/2000 | Kim | 708/319 |
| 6,125,155 A | * | 9/2000 | Lesthievent et al. | 708/316 |

* cited by examiner

Primary Examiner—Tan V. Mai
(74) Attorney, Agent, or Firm—Blakely, Sokoloff, Taylor & Zafman LLP

(57) ABSTRACT

An analog discrete-time filter that processes multiple output samples in parallel is disclosed. The simultaneous parallel processing of multiple samples permits improved sampling rate and improved accuracy as compared to prior art filters.

14 Claims, 7 Drawing Sheets

ANALOG DISCRETE-TIME FIR FILTER

BACKGROUND OF THE INVENTION

For signals with very high bandwidth, analog filtering is often more economical than digital filtering. Even where costs are less important, there are still cases where analog filtering is the only viable method for performing signal-processing functions.

Examples of high-bandwidth signals that may require analog filtering include disk drive read channels, radio communication channels, wireline communication channels and fiber-optic communication channels. The types of processing that must be performed on these signals include channel response equalization and channel phase compensation.

Three broad categories encompass several prior art analog filters. These categories may be distinguished based on the type of method each uses to create signal delays during the filtering process.

In FIG. 1, a representative continuous-time integrator based filter is shown and generally designated 100. Filter 100, and other filters included in this category generate signal delays using a series of integrators 102 (that are individually labeled in FIG. 1 as 102a–102n). Each integrator 102 is typically implemented as an inductor or capacitor. The primary disadvantage of this type of filter is that it cannot compensate for distributed or noncausal errors in the channel.

FIG. 2 shows an example of a continuous-time transmission-line based filter 200. Unlike Filter 100, Filter 200 has a finite impulse response (FIR) (i.e., the filter is non-recursive and does not process feedback). For Filter 200, signal delays are generated by a plurality of transmission lines 202. Each transmission line 202C is typically implemented as a stripline. The primary disadvantage of the type of filter is that the transmission lines are physically large. As a result, it is difficult to implement circuits of this type in integrated-circuit technologies.

FIG. 3 shows an example of a discrete-time analog filter 300. In this type of filter, delays are generated by a series of sample-and-hold circuits 302. Filter 300 has a finite impulse response (FIR) and is further described in U.S. Pat. No. 4,316,258, issued to Berger, et. al., for an invention entitled "Digitally programmable filter using electrical charge transfer".

Operation of filter 300 can be described as follows: The first sample and hold circuit 302a samples the input signal x(t) at uniformly spaced times 0, T, 2T, . . . and generating samples x(0), x(T), x(2T), . . . The second sample and hold circuit 302b samples the output of sample and hold circuit 302a before sample and hold circuit 302a acquires a new sample (e.g., between times O and T), thus obtaining the previous sample value (e.g., x(o)). Therefore, at time t=kT, the output of circuit 302a is x(kT) whereas the output of circuit 302b is x((k-1)T). Each sample and hold circuit 302I behaves in this manner relative to its preceding circuit. The output of each sample and hold circuit 302n at time t=kT is therefore as shown in FIG. 3. To perform the filtering, each of the output samples Sn from each circuit 302n is multiplied by a coefficient Cn, and the resulting products are then added together. The result is a filtered version of the sampled input signal with the filter transfer function given by:

$$H(z) = C_0 + C_1 z^{-1} + C_2 z^{-2} + \ldots$$

where z is the unit delay operator. The filter architecture of FIG. 3 suffers from several significant disadvantages. First each sample and hold circuit 302n samples during the hold phase of the preceding sample and hold circuit 302 in the pipeline, thus requiring two track-and-holds for each filter tap. Second, noise, offset, and nonlinearity errors accumulate as the signal propagates along the chain of sample and hold circuits 302. See S. Kiriaki, T. L. Viswanathan, G. Feygin, B. Stazewski, R. Pierson, B. Krenik, M. de Wit, K. Nagaraj, "A 160-MHz Analog Equalizer for Magnetic Disk Read Channels", IEEE Journal of Solid State Circuits, vol. 32, no. 11, November 1997, pp. 1839–1850.

An architecture that does not have these two disadvantages is illustrated by filter 400 of FIG. 4. Filter 400 has a finite impulse response. Filter 400 includes a series of n+1 track and hold circuits 402, a crosspoint switch matrix 404, a series of n multipliers 406 and an adder 408.

Track and hold circuits 402 have two operational states. During track mode, track and hold 402 transfers their input to their outputs with a gain of one. During hold mode, track and hold circuits 402 outputs their last transferred values. This differs from sample and hold circuits, which output sample value without having a tracking (transfer or pass-through) mode.

Crosspoint switch matrix 404 has n+1 inputs and n outputs. Each track and hold circuit 402 is connected to one of these inputs. Each of these outputs is connected to a respective multiplier 406i. The outputs of multipliers 406 are connected to the n inputs of an adder 408. Crosspoint 404 switch matrix contains a switch connecting each of its (n+1) inputs to each of its n outputs, with one switch per output being closed at any given time. This allows crosspoint switch matrix 404 to select any set of n inputs from among the n+1 inputs and pass that set of n inputs to its n outputs.

A control circuit (not shown) clocks and controls the operation of filter 400. During each clock period, the control circuit causes one track and hold circuit 402 (known as the active track and hold circuit 402) to track the input signal. This means that the active track and hold 402 transfers its input (the input signal) to its output with a gain of one. The control circuit causes the remaining track and hold circuits 402 to remain in hold mode. Each of these track and hold circuits 402 outputs its last transferred value of the input signal. During subsequent clock periods, the control circuit causes the active track and hold circuit 402 to rotate among the series of track and hold circuits 402.

At time t=kT, valid samples will be present in the inactive track and holds, the samples representing x((k-1)T), x((k-2)T), . . . x((k-n)T). The location of the samples at the inputs to matrix 404 will be different at each instant of time. However, because of the rotating nature of the sampling, e.g., the control circuit configures the crosspoint switch matrix 404 to map the inputs from the appropriate track and hold circuits 402 (i.e., the track and hold circuits 402 having valid sample values) to respective multipliers 406. The multiplied samples are forwarded to adder 408. Adder 408 sums the multiplied samples to form a filtered output signal y[k].

Filter 400 suffers from several disadvantages. First, the number of switches in crosspoint switch matrix 404 grows roughly as the square of the number of taps:

$$N_{switch} = n(n+1).$$

The large number of switches results in a large parasitic capacitance at each of the input and output terminals of crosspoint switch matrix 404. This limits the speed of operation of the circuit. Second, the sampled signal must traverse the entire signal path, including crosspoint switch matrix 404, multipliers 406 and adder 408, within one clock cycle. For systems with high sampling rates (typically above 1–5 GHz), certain integrated circuit technology is not fast enough to perform all the processing with sufficient accuracy within the sample period. As a result, filters using this architecture may suffer from a bottleneck in terms of sampling rate and accuracy.

Additional description of Filter 400 may be found in: 1) S. Kiriaki, T. L. Viswanathan, G. Feygin, B. Stazewski, R. Pierson, B. Krenik, M. de Wit, K. Nagaraj, "A 160-MHz Analog Equalizer for Magnetic Disk Read Channels", IEEE Journal of Solid State Circuits, vol. 32, no. 11, November 1997, pp. 1839–1850. 2) Kiriaki, et al., "FIR filter architecture", U.S. Pat. No. 6,035,320, Mar. 7, 2000. 3) Carley, "Sample and hold circuit and finite impulse response filter constructed therefrom", U.S. Pat. No. 5,414,311, May 9, 1995.

For these and other reasons, a need exists for improved methods for analog filtering. This need is present in cases where bandwidth requirements are high and error rates are required to be low.

SUMMARY

The present invention relates to an improved filter architecture that calculates two or more (e.g., m>1) samples of the filter output in parallel. The parallel outputs can be used in parallel, typically as the inputs to a series of parallel analog to digital converters.

In one embodiment, at least m track and hold circuits are active at any time. Specifically, the filter comprises n+2m−1 track and holds, of which m are active and n+m−1 are inactive at any given time. The m active track and holds transition from the track phase to the hold phase in a staggered fashion. This results in the m active track and holds sampling the input at times x(kT), x((k−1)T), . . . x((k−m+1)T). The role of the m active track and holds is rotated among the available track and holds in a group fashion. First, one group of track and holds T1 . . . Tm are active, then another group of track and holds $T_{m+1}$ . . . $T_{2m}$ are active, and so forth until track and holds $T_{n+m-1}$ . . . $T_{n+2m-1}$ are active, after which $T_1$ . . . $T_m$ become active again. Because the "active" role of each group of track and holds changes only every mth sample period, the outputs of the inactive track and holds remain constant for an interval of m sample periods.

During this interval of m sample periods, m samples of the filter output are calculated in parallel. A switch matrix is used to place the input samples obtained by the track and holds in the proper order for the filtering operations. The output of the switch matrix is a series of samples x((k−1)T) . . . (x(k−n−m+1)T. Because the order within each group of m sample and holds remains constant, the switch matrix only needs to select from among the (n−1)/m+2 groups. This reduces the size of the switch matrix by a factor of m.

Specifically, the size of the crosspoint switch matrix is reduced from n (n+1) switches to approximately $$N_{switch}=(n+m-1)(n+2m-1)/m$$

and the time allotted for the signal to traverse the crosspoint switch matrix, the multipliers and the adder is increased from T to mT.

The ordered input samples provided by the matrix are then multiplied by the corresponding filter coefficients to produce the first filtered output y[k]

$$y[k]=C_0x((k-1)T)+C_1x((k-2)T)+C_2x((k-3)T)+\ldots+C_{n-1}x((k-n)T)$$

The second filter output is generated by applying the same filter coefficients to a shifted version of the series of input samples $$y[k-1]=C_0x((k-2)T)+C_1x((k-3)T)+C_2x((k-4)T)+\ldots+C_{n-1}x((k-n-1)T)$$

and subsequent filter outputs are generated in an analogous fashion.

If (n−1)/m is not an integer, then the architecture can still be implemented, but the number of sample and holds increases to m*ceil((n−1)/m)+2m where ceil(u) denotes the smallest integer greater than or equal to u.

To allow for a longer tracking period, additional track and holds can be added in groups of m. In this case, the number of track and holds active at any given time is p+m, where p is the number of extra track and holds added.

DETAILED DESCRIPTION

Figure 1:
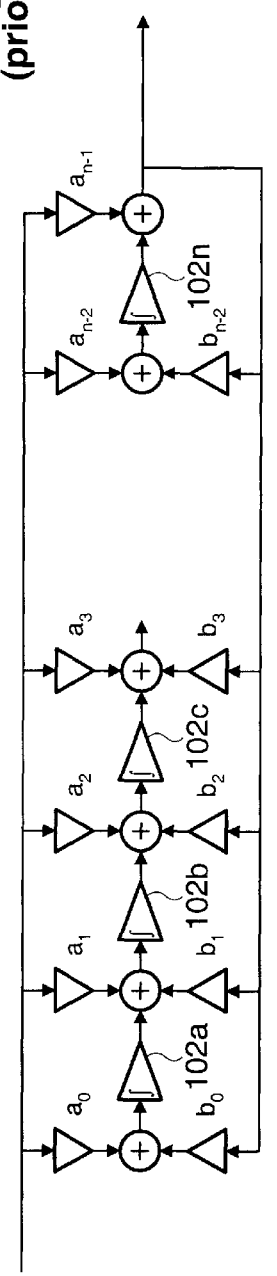
FIG. 1 is a block diagram showing a prior art continuous-time integrator based filter.
Figure 2:
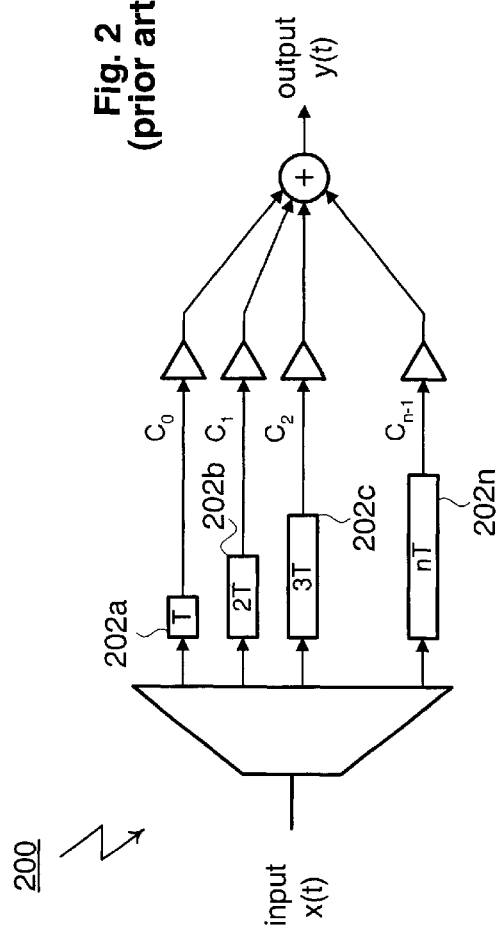
FIG. 2 is a block diagram showing a prior art continuous-time transmission-line based filter.
Figure 3:
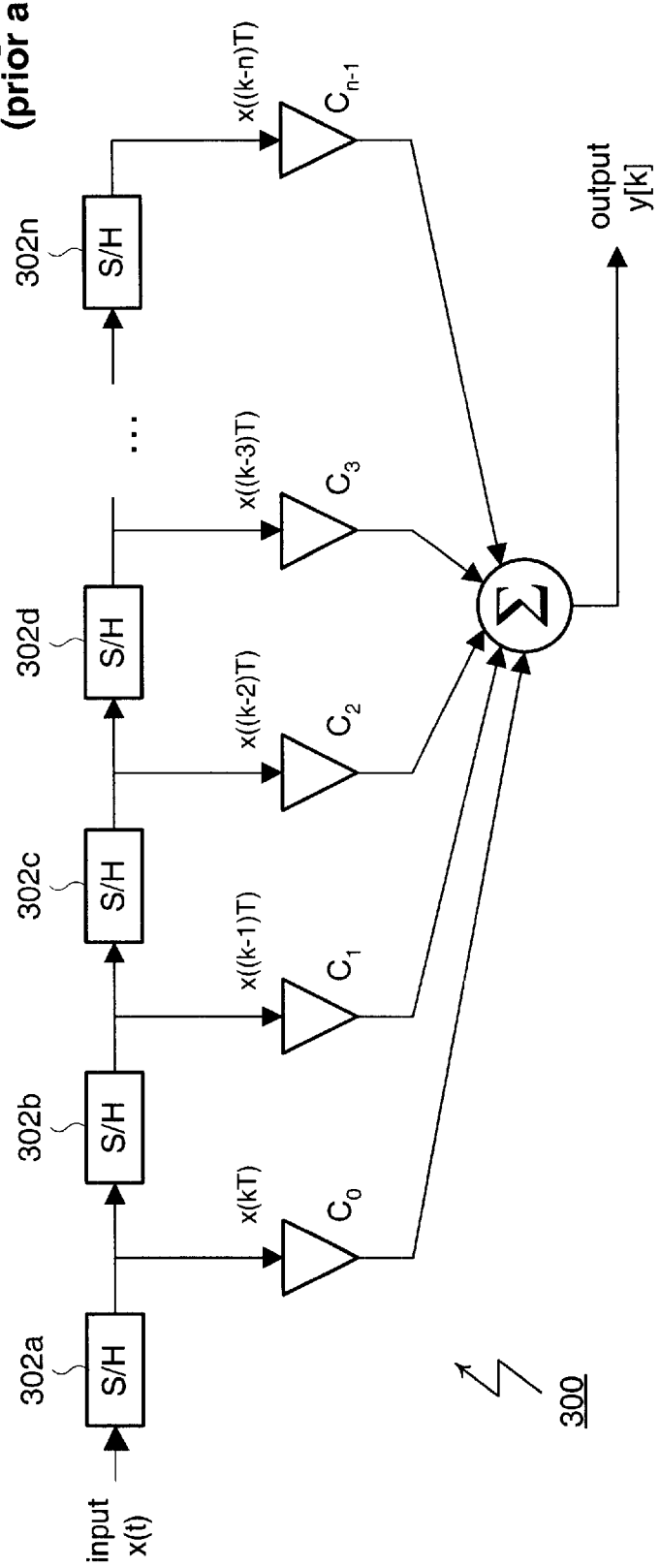
FIG. 3 is a block diagram showing a prior art discrete-time analog filter.
Figure 4:
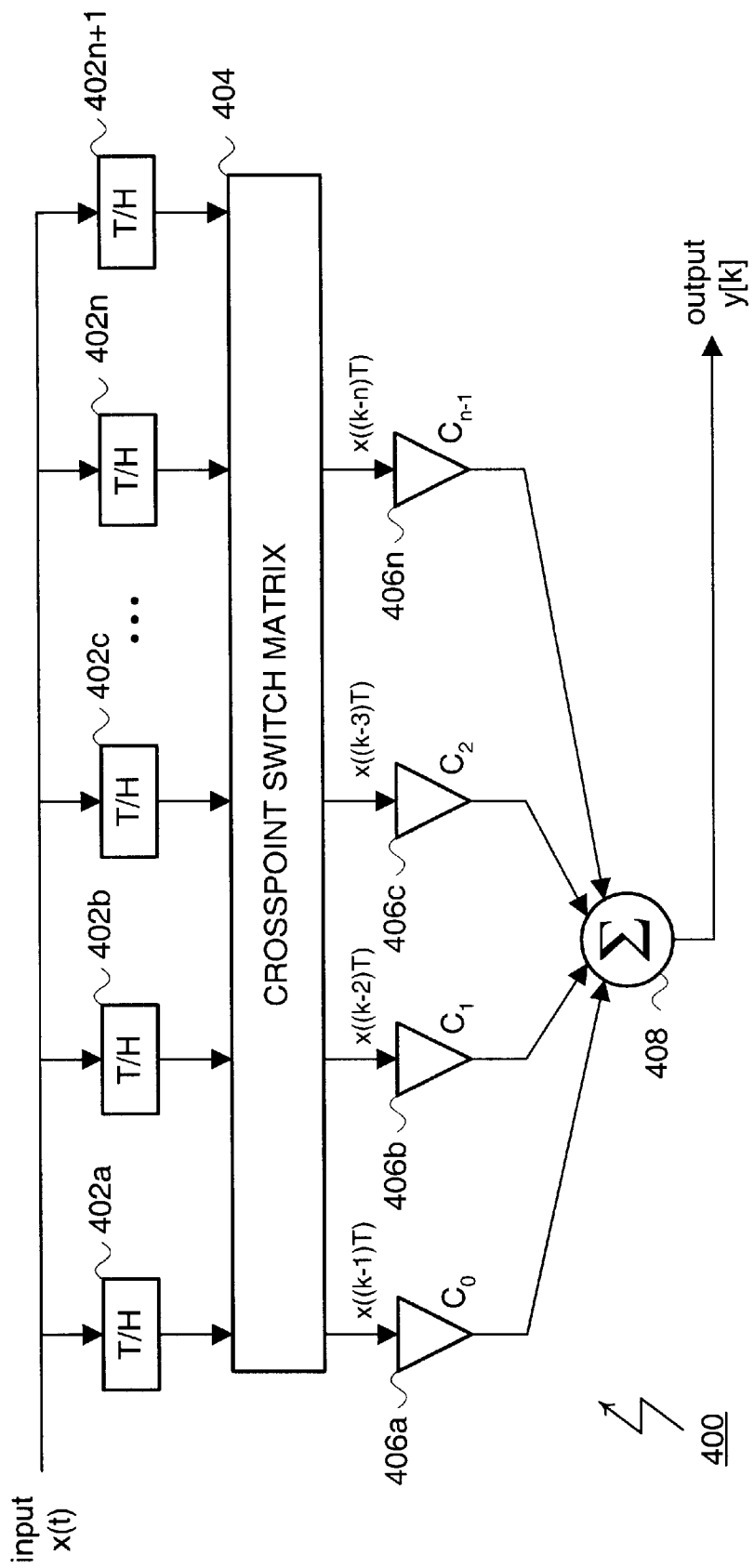
FIG. 4 is a block diagram showing a prior art finite impulse response filter.
Figure 5:
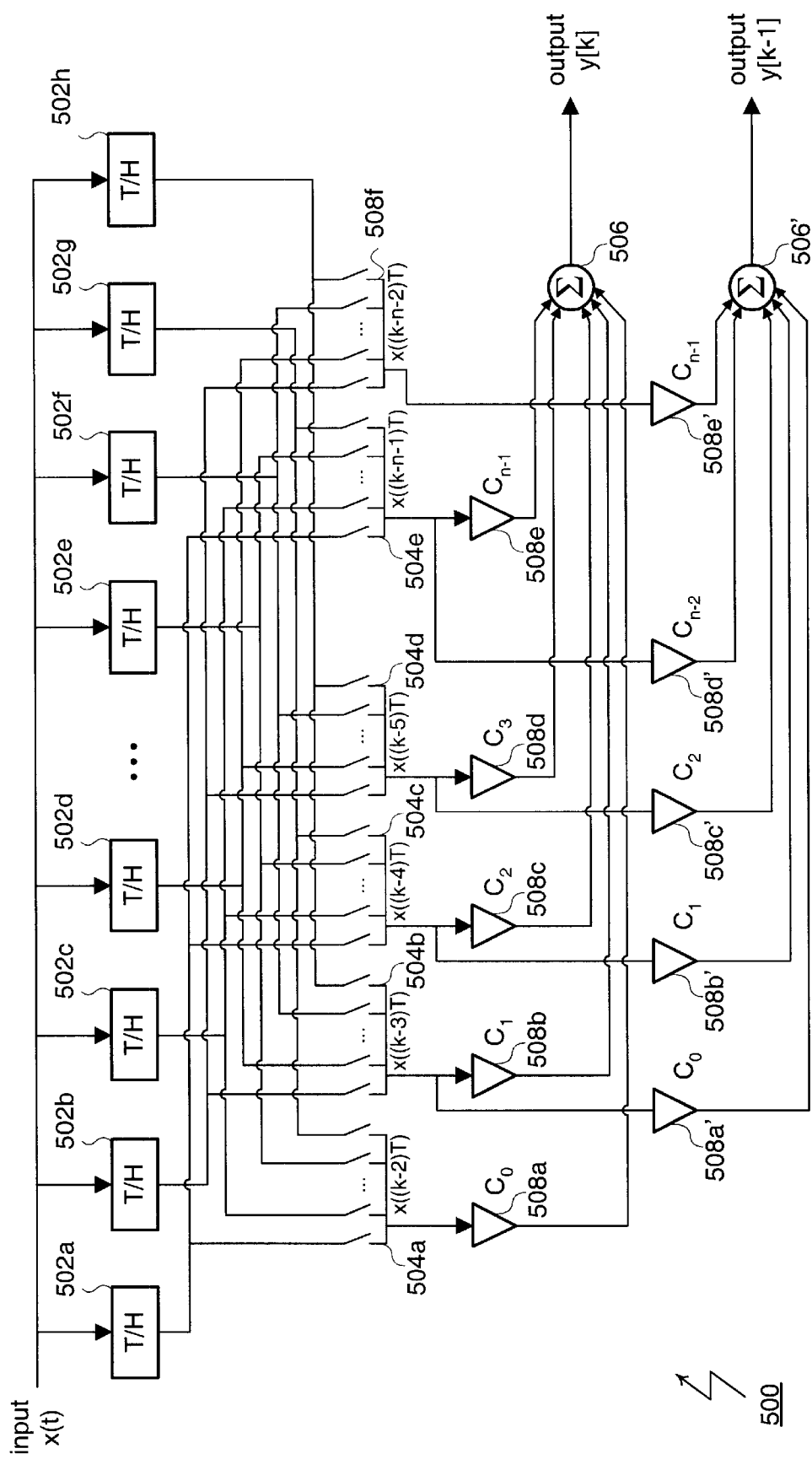
FIG. 5 is a block diagram showing an embodiment of the FIR filter of the present invention.

In FIG. 5, an Analog Discrete-Time FIR Filter 500 is shown as a representative embodiment of the present invention. Filter 500 receives an analog input signal. This description refers to the input signal as x(t) where t represents time. As filter 500 operates, it samples the value of input signal x(t) on a repeating, periodic basis. This description refers to the period between successive samples as the sample period or T. For the purposes of description, the sampling instant is referred to as k*T or kT. The immediately preceding sampling instants are referred to as (k−1)T, (k−2)T and so on.

Filter 500 produces two or more analog input signals in parallel. This description refers to these outputs as y[k], y[k−1] up to y[k−m+1]. The exemplary circuit illustrated in FIG. 5 shows a total of two outputs (i.e., m equals two) labeled y[k] and y[k−1]. Filter 500 produces its m outputs every m sample periods (i.e., m*T). In the case of the exemplary circuit in FIG. 5, this means that filter 500 produces two outputs in parallel every two sample periods (2*T).

Structurally, Filter 500 includes the following components: a series of j track and hold circuits 502, a series of multiplexers 504, a series of m adders 506 and a series of multipliers 508. The function of each of these components will be described below.

Filter 500 the series of j track and hold circuits 502 to to sample input signal x(t). For the representative embodiment of FIG. 5, there are a total of eight (j equals eight) track and hold circuits labeled individually labeled 502a–502h. Each track and hold circuit 502 has two operational modes: track mode and hold mode. When operating in track mode, track and hold circuits 502 continuously transfer input signal x(t) to their outputs with a gain of one. Entering hold mode causes track and hold circuits 502 to retain their last transferred value for input signal x(t). Track and hold circuits 502 are intended to be representative. For some embodiments, other circuits, such as sample and hold circuits, may replace track and hold circuits 502.

For a particular embodiment, the number j of track and hold circuits 502 is selected to reflect resolution requirements of the filter. For examples of this type of selection, see: Alan V. Oppenheim and Ronald W. Schafer, Discrete-Time Signal Processing, Prentice-Hall, ISBN 0-13-216292-X, 1989. Suitable types for track and hold circuits 502 include, but are not limited to: switched emitter, diode bridge, and MOSFET capacitor. (I couldn't read the author you referenced here).

A subset of the j track and hold circuits 502 must be matched by a switch matrix to the inputs of multipliers 508. Because each of the m parallel paths must have the same number of multipliers 508, the number n of multipliers 508 in each path and the number m of parallel outputs y[k] determine the number j. This relation can be expressed as j=n+2m−1, where n is the number of multipliers 508 per path. In this equation, n varies to increase or decrease the number of track and hold circuits 502 included in filter 500, depending on the embodiment. The addition of 2m−1 in the equation ensures that the number of track and hold circuits 502 is suitable for the number m of parallel outputs y[k].

Within filter 500, track and hold circuits 502 are subdivided into a series of logical groups. Each logical group includes m track and hold circuits 502. For the specific example of FIG. 5, it may be assumed that a pair of track and hold circuits 502a and 502b form one logical group. Another pair of track and hold circuits 502c and 502d form a second logical group. This pairing arrangement continues, with track and hold circuits 502c and 502d, track and hold circuits 502e and 502f and track and hold circuits 502g and 502h. Note that the number m (in this example 2) of track and hold circuits included in a group is equal to the number of outputs to be generated in parallel.

Filter 500 includes a timing and control circuit (not shown) that controls the operation of track and hold circuits 502. The timing and control circuit selectively enables or disables track mode in each of the track and hold circuits 502 so that the logical groups track and hold circuits 502 sample input signal x(t) on a rotating basis. For this rotation, a new logical group enters track mode every m sample periods (mT). For the example of FIG. 5, this means that a new logical group of two sample and hold circuits 502 enters track mode every two sample periods (2*T). The remaining logical groups (a total of three for filter 500) are in hold mode.

Figure 6:
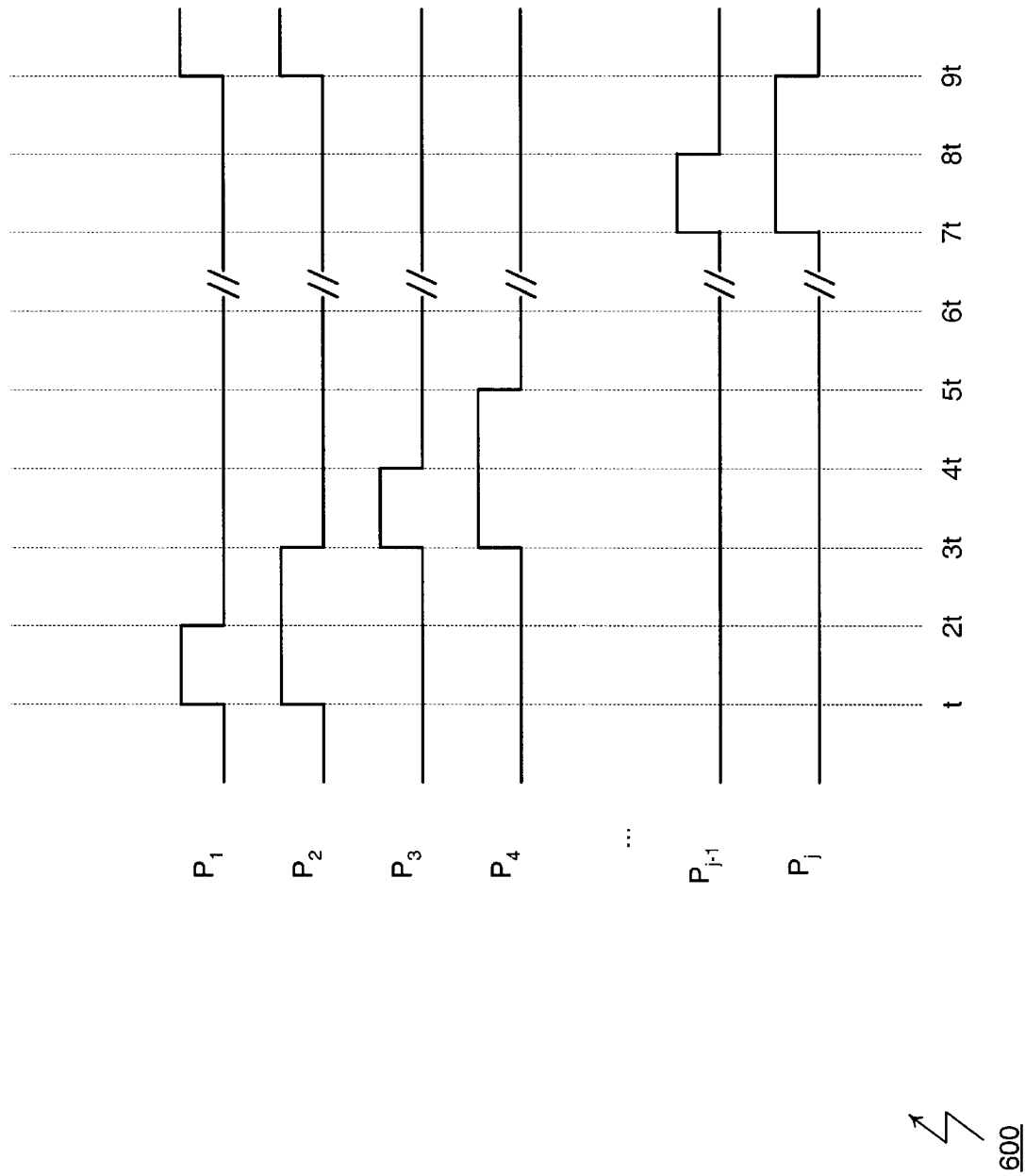
FIG. 6 is a timing diagram showing operation of the track and hold circuits included in the filter of FIG. 5.

As shown in FIG. 6, rotation between logical groups causes a first logical group (e.g., both circuits 502a and 502b) to enter track mode at time T. A second logical group (e.g., circuits 502c and 502D) enters track mode at time 3T. Third and fourth logical groups enter track mode at times 5T and 7T respectively. For the example of FIG. 5, (i.e., where there are four logical groups), the cycle would then repeat with the first logical group re-entering track mode at time 9T.

The timing and control circuit causes track and hold circuits 502 to stop tracking and enter hold mode on a sequential basis. This is shown, for example, in FIG. 6. In that figure, the first logical group (e.g., both circuits 502a and 502B) enters track mode at time T as illustrated by graphs P1 and P2. One of the track and hold circuits 502 (e.g., circuit 502a) within the first logical group is deactivated at time 2T as illustrated by graph P1. The second track and hold circuit 502 (e.g., circuit 502b) enters hold mode slightly later at time 3T as illustrated by graph P2. If more than two track and hold circuits 502 were included in each logical group (i.e., if m had a value greater than two) they would enter hold mode in sequence, e.g., at 4T, 5T, etc.

This pattern in which track and hold circuits 502 of a logical group enter hold mode at successive instants causes a sequence of samples of input signal x(t) to be stored in track and hold circuits 502. At any given time T, the track and hold circuits 502 which are in hold mode contain samples of input signal x(t) taken at times (k−2)T through (k−j+1)T. For the example where j is eight, track and hold circuits 502 would include samples taken at (k−2)T, (k−3)T, (k−4)T, (k−5)T, (k−6)T and (k−7)T. These samples are referred to as x((k−2)T), x((k−3)T) and so on.

Filter 500 multiplies and combines the samples stored in track and hold circuits 502 to create outputs y[k] and y[k−1] as follows:

$$y[k]=C_0 x((k-2)T)+C_1 x((k-3)T)+C_2 x((k-4)T)+\ldots+C_{n-1} x((k-n-1)T)$$

$$y[k-1]=C_0 x((k-3)T)+C_1 x((k-4)T)+C_2 x((k-5)T)+\ldots+C_{n-1} x((k-n-2)T)$$

Creating one of the parallel outputs y[k] requires filter 500 to select a sequence of the samples stored in the inactive track and hold circuits 502 (namely samples x((k−2)T), x((k−3)T), x((k−4)T), x((k−5)T), x((k−6)T) and x((k−7)T). Filter 500 multiplies each one of these by a respective filter coefficient ($C_0$, $C_1$, $C_2$, $C_3$ and $C_5$). The multiplied samples are then added together to form output y[k].

Filter 500 creates another of the parallel outputs y[k−1] in a similar fashion. In the case of output y[k−1], however, a slightly different set of samples are used x((k−3)T), x((k−4)T), x((k−5)T) and x((k−6)T) and x((k−7)T). The sequence of samples used for output y[k−1] start earlier in time than the sequence of samples used for output y[k] (i.e., at k−3 compared to k−2). The sequence of samples used for output y[k−1] start also end earlier in time than the sequence of samples used for output y[k] (i.e., at k−n−2 compared to k−n−1). For this reason, the sequence of samples used to generate output y[k−1] may be thought of as a time shifted version of the samples used to generate output y[k]. Outputs y[k] and y[k−1] similarly represent time shifted filtered versions of input x(t).

To select the samples used to create outputs y[k] and y[k−1] filter 500 includes a switching network. For the particular embodiment being described, the switching network includes a series of n+m−1 multiplexers 504. Each multiplexer 504 has one input for each logical group of track and hold circuits 502. In the example of filter 500, illustrated in FIG. 5 where there are four logical groups of track and hold circuits, each multiplexer 504 has four inputs. Each multiplexer 504 closes the connection to one track and hold circuit 502 in each logical group at any given time under the control of the timing and control circuit.

As an example, multiplexer 504a is connected to track and hold circuits 502a, 502c, 502e, and 502g. First, multiplexer 504a is, therefore, connected to the first track and hold circuit 502 in each logical group. Multiplexer 504b is connected to track and hold circuits 502b, 502d, 502f, and 502h. Second, multiplexer 504b is, therefore, connected to the second track and hold circuit 502 in each logical group. Additional multiplexers may be connected to additional circuits (if present) in the first logical group. Multiplexer 504c is connected to the first track and hold circuit 502 in the next logical group.

Figure 7:
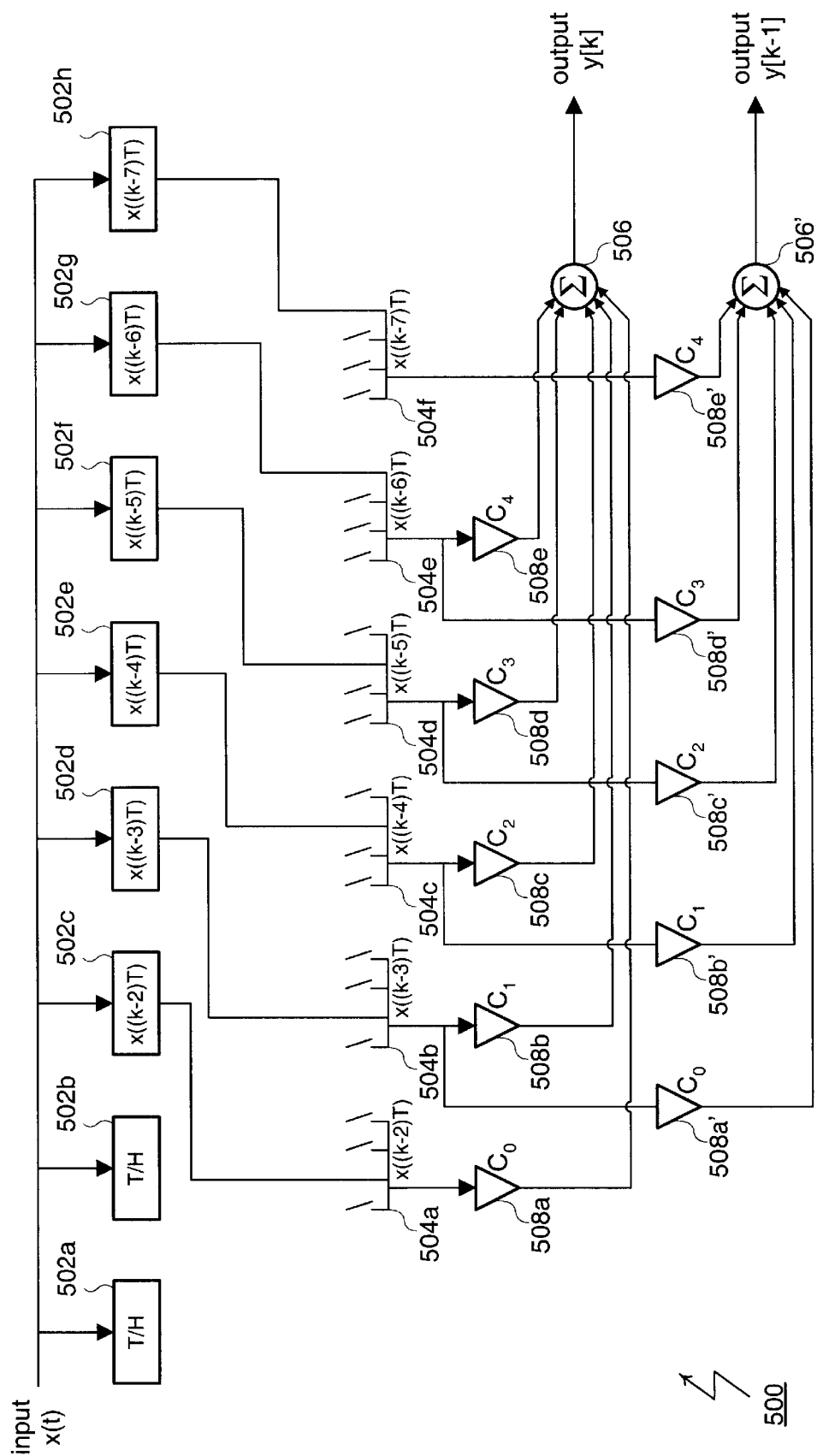
FIG. 7 is a block diagram showing an embodiment of the FIR filter of the present invention during a first time interval.

The interconnections between multiplexers 504 and track and hold circuits 502 allow multiplexers 504 to select the sequences of samples required to generate outputs y[k] and y[k−1]. This is illustrated by comparison of FIGS. 7 and 8. In FIG. 7, filter 500 of FIG. 5 is shown with track and hold circuits 502a and 502b in track mode. During such an active mode, the respective multiplexers 504a and 5045b are configured to disconnect circuits 502a and 502b from their respective multiplier 508a and 508b. Track and hold circuits 502c through 502h are in hold mode and include samples taken at times (k−2)T, (k−3)T, (k−4)T, (k−5)T, (k−6)T and (k−7)T. Multiplexers 504 have been configured to select their inputs corresponding to track and hold circuits 502c through 502h. As a result, multiplexers 504a through 504f are forwarding respective samples taken at times (k−2)T, (k−3)T, (k−4)T, (k−5)T, (k−6)T and (k−7)T.

Figure 8:
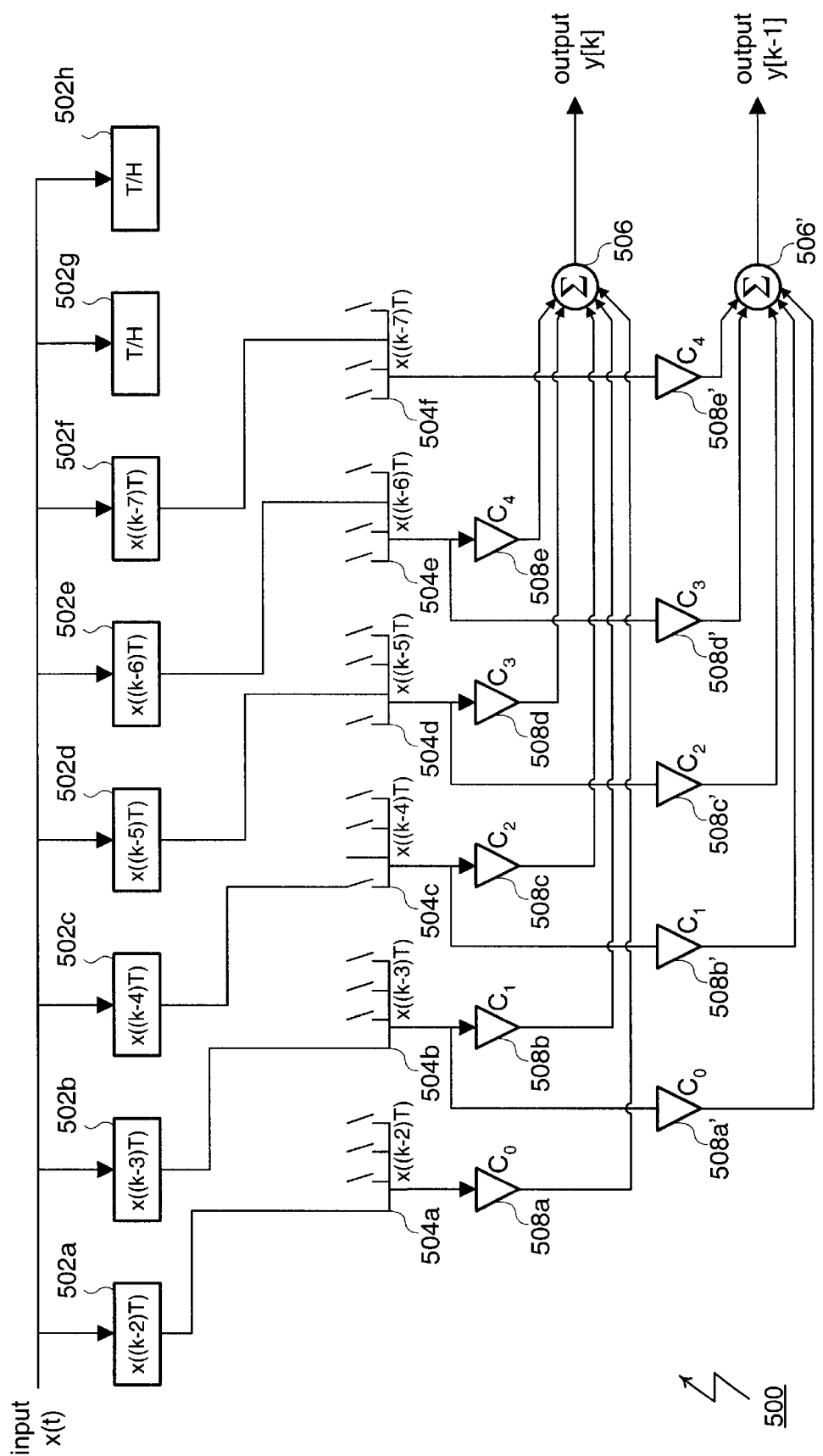
FIG. 8 is a block diagram showing the filter of FIG. 7 during a second time interval.

FIG. 8 shows the same filter 500 at a time two sample periods after FIG. 7. The samples in track and hold circuits 502c through 502f have aged. As a result these samples are now properly labeled (k−4)T, (k−5)T, (k−6)T and (k−7)T, respectively. Track and hold circuits 502g and 502h have become active. The samples in these track and hold circuits 502 have, therefore, been discarded. Formerly active track and hold circuits 502a and 502b have now become inactive. They hold samples taken at times (k−2)T and (k−3)T. The overall result is that track and hold circuits 502a through 502f are in hold mode and include samples taken at times (k−2)T, (k−3)T, (k−4)T, (k−5)T, (k−6)T and (k−7)T. Multiplexers 504 have been configured to select their inputs corresponding to track and hold circuits 502a through 502f. As a result, multiplexers 504a through 504f are forwarding (once again) respective samples taken at times (k−2)T, (k−3)T, (k−4)T, (k−5)T, (k−6)T and (k−7)T.

Filter 500 includes a respective adder 506 for each of its m outputs. In FIG. 5, these are adder 506 for output y[k] and adder 506' for output y[k−1]. Filter 500 includes n multipliers for each adder 506. The multipliers 508 for each adder 506 have filter coefficients of $C_0$ through $C_{n-1}$. In the specific case of filter 500, the five multipliers 508 of each adder 506 have respective filter coefficient ($C_0$, $C_1$, $C_2$, $C_3$ and $C_4$). Each multiplier 508 is connected to receive, as input, the sample value output by one of multiplexers 504. In the case of adder 506, multiplier 508a receives sample taken at time (k−2)T from multiplexer 504a. As a result, adder 506 receives the sample value taken at time (k−2)T multiplied by the filtering coefficient $C_0$. Multiplier 508b receives sample taken at time (k−3)T from multiplexer 504b. As a result, adder 506 also receives the sample value taken at time (k−3)T multiplied by the filtering coefficient $C_1$. The remaining inputs to adder 506 receive sample values taken at times (k−4)T, (k−5)T and (k−6)T multiplied (respectively) by filtering coefficients $C_2$, $C_3$ and $C_4$. Adder 506 combines these inputs and creates output y[k] as:

$$y[k]=C_0 x((k-2)T)+C_1 x((k-3)T)+C_2 x((k-4)T)+ \ldots +C_{n-1}x((k-n-1)T)$$

Similar connections for adder 506' allow adder 506' to create output y[k−1] as:

$$y[k-1]=C_0 x((k-3)T)+C_1 x((k-4)T)+C_2 x((k-5)T)+ \ldots +C_{n-1}x((k-n-2)T)$$

The preceding describes a particular embodiment for filter 500 (e.g., that generates only a pair of parallel values). It should be appreciated that the present invention is intended to include a wide range of embodiments. In particular, the values described for m (the number of parallel outputs) and n (the number of multipliers per path) are intended to be completely variable to accommodate the different performance requirements and different applications.

Although particular embodiments of the present invention have been shown and described, it will be obvious to those skilled in the art that changes and modifications may be made without departing from the present invention in its broader aspects, and therefore, the appended claims are to encompass within their scope all such changes and modifications that fall within the true scope of the present invention.

What is claimed is:

1. A filter, comprising:
    n+2m−1 track and hold circuits, n and m being integers, each coupled to receive an input signal and to produce a sampled version of the input signal;
    a crosspoint switch matrix configured to receive n+2m−1 sampled versions of the input signal from the track and hold circuits and to produce n+m−1 selected samples; and
    m parallel output paths, each coupled to receive a subset n of the selected samples from the crosspoint switch matrix such that a first one of the output paths receives first through $n^{th}$ ones of the selected samples, a second one of the output paths receives second through n+$1^{th}$ of the selected samples, and so on for all m output paths with an $m^{th}$ one of the output paths receiving an $m^{th}$ through n+m−$1^{th}$ of the selected samples, each parallel output path being configured to produce a respective output signal which is a sum of products of the subset of selected samples and respective filter coefficients.

2. A filter as in claim 1 wherein only m of the track and hold circuits are active at any particular point in time.

3. A filter as in claim 2 wherein the track and hold circuits transition from a track phase to a hold phase in a staggered fashion so as to provide the sampled versions of the input signal at times x(kT), x((k−1)T), x((k−2)T), . . . x((k−m+1)T), where T represents a sample period of the filter and k is an integer such that time t equals kT.

4. A filter as in claim 2 wherein the m number of active track and hold circuits is rotated among the n+2m−1 track and hold circuits in group fashion with each group of the track and hold circuits becoming active every (n−1)/m+$2^{th}$ sample period.

5. A filter as in claim 2 wherein outputs of inactive ones of the track and hold circuits remain constant for an interval of m sample periods.

6. A filter as in claim 1 wherein the crosspoint switch matrix outputs a series of samples x((k−1)T), . . . x((k−n−m+1)T) to the m parallel output paths, where T represents a sample period of the filter and k is an integer such that time t equals kT.

7. A filter as in claim 1 wherein the crosspoint switch matrix comprises a plurality of multiplexers.

8. A filter as in claim 7 wherein the plurality of multiplexers comprises n+m−1 multiplexers, each having (n−1)/m+2 inputs.

9. A filter as in claim 1 wherein each of the m output paths apply the same filter coefficients to time shifted ones of the sampled versions of the input signal.

10. A method, comprising:
    sampling an input signal using m active ones of n+2m−1 track and hold circuits, n and m being integers, to produce sampled versions of the input signal;
    using a crosspoint switch matrix, selecting n+m−1 ones of the sampled versions of the input signal produced by the track and hold circuits to produce n+m−1 selected samples; and in m parallel output paths each receiving n of the selected samples from the crosspoint switch matrix such that a first one of the output paths receives first through $n^{th}$ ones of the selected samples, a second one of the output paths receives second through $n+1^{th}$ of the selected samples, and so on for all m output paths with an $m^{th}$ one of the output paths receiving an $m^{th}$ through $n+m-1^{th}$ of the selected samples, multiplying the selected samples by respective filter coefficients to produce products and summing such products to produce m filter output signals.

11. The method of claim 10 further comprising rotating the m active ones of the track and hold circuits among the n+2m−1 track and hold circuits in a staggered fashion so as to provide the sampled versions of the input signal at times x(kT), x((k−1)T), x((k−2)T), . . . x((k−m+1)T), where T represents a sample period of the filter and k is an integer such that time t equals kT.

12. The method of claim 10 further comprising rotating the m number of active track and hold circuits among the n+2m−1 track and hold circuits in group fashion with each group of the track and hold circuits becoming active every $(n-1)/m+2^{th}$ sample period.

13. The method of claim 10 wherein each of the m parallel output paths uses the same filter coefficients.

14. The method of claim 10 wherein the crosspoint switch matrix produces the n+m−1 selected samples from the sampled versions of the input signal using n+m−1 multiplexers, each having (n−1)/m+2 inputs.

* * * * *